(12) United States Patent  
Galbi (10) Patent No.: US 8,331,133 B2  
(45) Date of Patent: Dec. 11, 2012

(54) APPARATUSES FOR REGISTER FILE WITH NOVEL BIT CELL IMPLEMENTATION

(75) Inventor: Duane E. Galbi, Cambridge, MA (US)

(73) Assignee: Intel Corporation, Santa Clara, CA (US)

( * ) Notice: Subject to any disclaimer, the term of this patent is extended or adjusted under 35 U.S.C. 154(b) by 591 days.

(21) Appl. No.: 12/492,907

(22) Filed: Jun. 26, 2009

(65) Prior Publication Data

US 2010/0332712 A1 Dec. 30, 2010

(51) Int. Cl.
*G11C 11/00* (2006.01)
(52) U.S. Cl. .............. 365/154; 365/189.02; 365/189.03; 365/230.05
(58) Field of Classification Search .................. 365/154, 365/189.02, 189.03, 189.04, 189.08, 230.05
See application file for complete search history.

(56) References Cited

U.S. PATENT DOCUMENTS

| | | | | |
|---|---|---|---|---|
| 6,078,546 | A * | 6/2000 | Lee | 365/233.11 |
| 7,203,100 | B2 * | 4/2007 | Kant et al. | 365/185.14 |
| 7,366,032 | B1 * | 4/2008 | Huber et al. | 365/189.04 |
| 2004/0060015 | A1 * | 3/2004 | Mochizuki | 716/1 |

* cited by examiner

*Primary Examiner* — Toan Le
(74) *Attorney, Agent, or Firm* — Schwabe, Williamson & Wyatt, P.C.

(57) ABSTRACT

Approaches to organizing/constructing a register file base cell in a way that reduces the number of signals which need to be routed to and through the bit base cell are disclosed. Base cells so constructed allow industry standard static timing approaches and tools to verify the timing of a register file comprised of such base cells as a whole and allow industry standard place-and-route (APR) tools to be used to implement the connections between the base cells and the other register file logic not directly included in the base cell.

29 Claims, 10 Drawing Sheets

APPARATUSES FOR REGISTER FILE WITH NOVEL BIT CELL IMPLEMENTATION

BACKGROUND

In integrated electronic devices, such as micro-processors or other system on a chip (SOC) designs, register files are an important internal design element. Register files may be used to allow a device to maintain internal states. They may also be used to buffer data, to buffer control commands, and in a wide variety of other design applications to store values internal to the design. One important design parameter of a register file is the number of ports which a register file provides. A port can be either a read port (allow data to be read), a write port (allow the state of the register to be set), or a read-write port (which may function as either a read port or a write port). A register file is different from a register in that a register file uses a set of address bits to help determine which registers, often referred to as "base cells", in the register file should be operated on.

Figure 1:
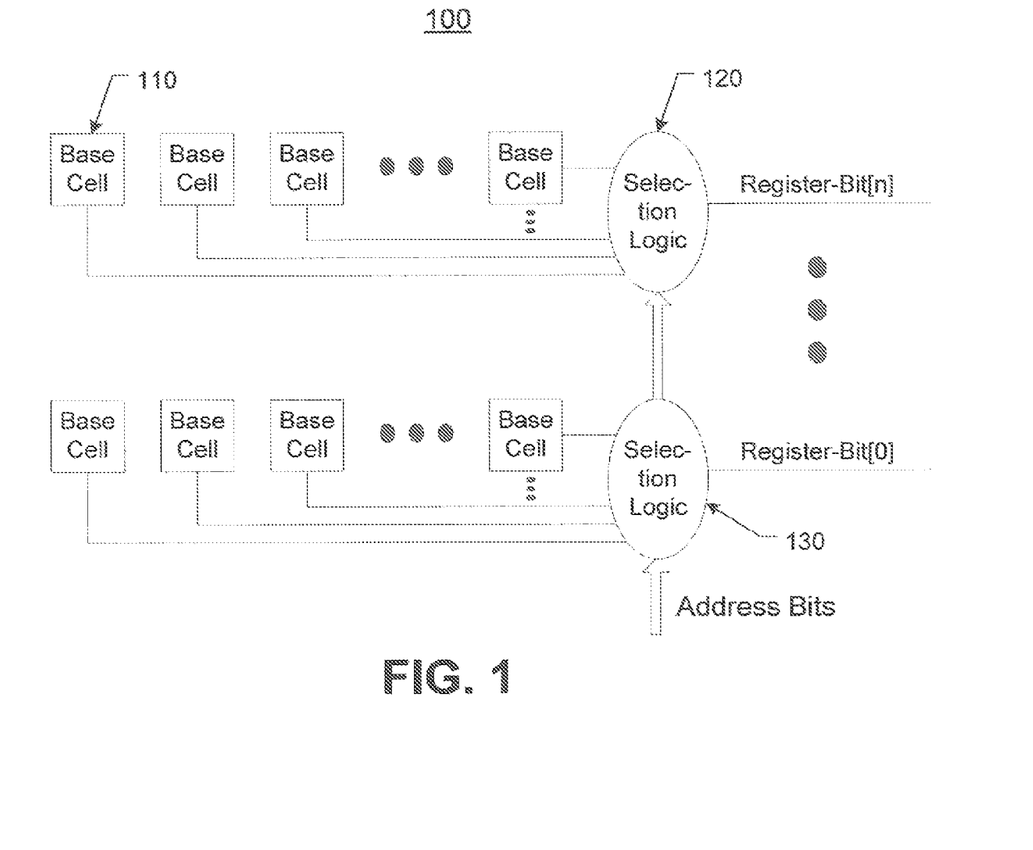
FIG. 1 illustrates a typical register file.

FIG. 1 illustrates a typical register file 100 which has a plurality of rows of base cells such as base cell 110. Each row of base cells corresponds to selection logic such as 120 and 130. Base cells in the row are coupled to the selection logic so that the selection logic can select an appropriate base cell to be operated on by a port according to an address of the port. The selection method may be fully or partially contained within the base cell or be solely external to the base cell. FIG. 1 is an example of read selection logic being external to the base cell.

Figure 2:
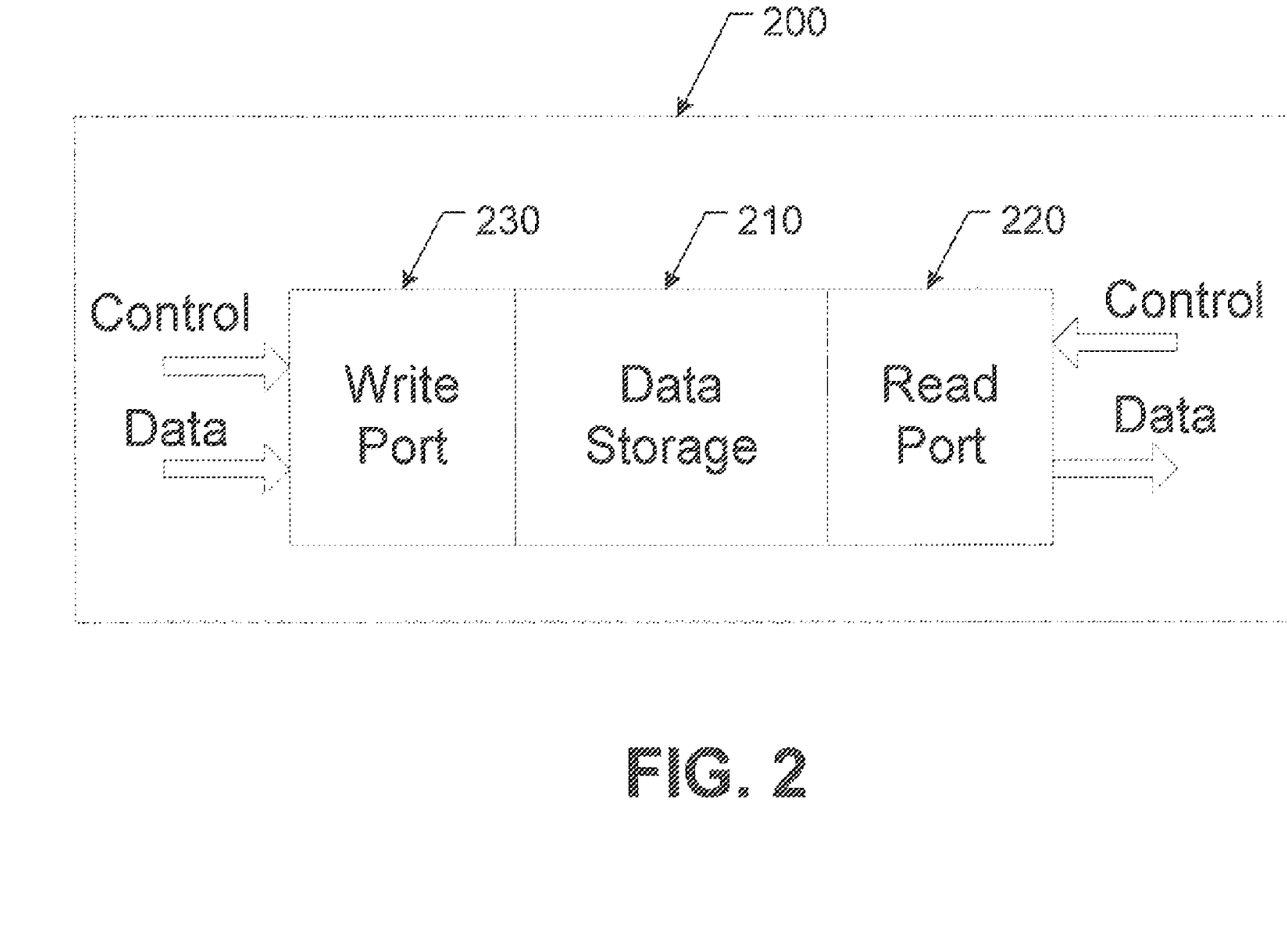
FIG. 2 illustrates a structure of a base cell of a register file.

There may be different design approaches to constructing a base cell of a register file. FIG. 2 illustrates a structure of a base cell 200 of a register file. Base cell 200 includes three basic parts: a center part 210, a read port 220, and a write port 230. Center part 210 may also be referred to as a "data storage" part which includes a stored cell state. Typically only one copy of the center part structure exists for each base cell. Read port 220 is typically replicated for each read port of the register file. Similarly write port 230 is replicated for each write port of the register file. For basic cells which have a read-write port, a "read port" and a "write port" are combined into one structure.

BRIEF DESCRIPTION OF THE DRAWINGS/FIGURES

The features and advantages of the disclosed subject matter will become apparent from the following detailed description of the subject matter in which.

DETAILED DESCRIPTION

The embodiments and examples described herein are not the only applications or uses contemplated for the present invention. The specific embodiments discussed are merely illustrative of specific ways to make and use the present invention, and do not limit the scope of the present invention. The figures are for illustrative purposes and are not drawn to scale. The figures are described in terms of a particular vertical and horizontal organization, but the figures could be easily rotated by any angle and the description could be updated without affecting the scope of the present invention.

Reference in the specification to "one embodiment" or "an embodiment" of the disclosed subject matter means that a particular feature, structure or characteristic described in connection with the embodiment is included in at least one embodiment of the disclosed subject matter. Thus, the appearances of the phrase "in one embodiment" appearing in various places throughout the specification are not necessarily all referring to the same embodiment.

Figure 3:
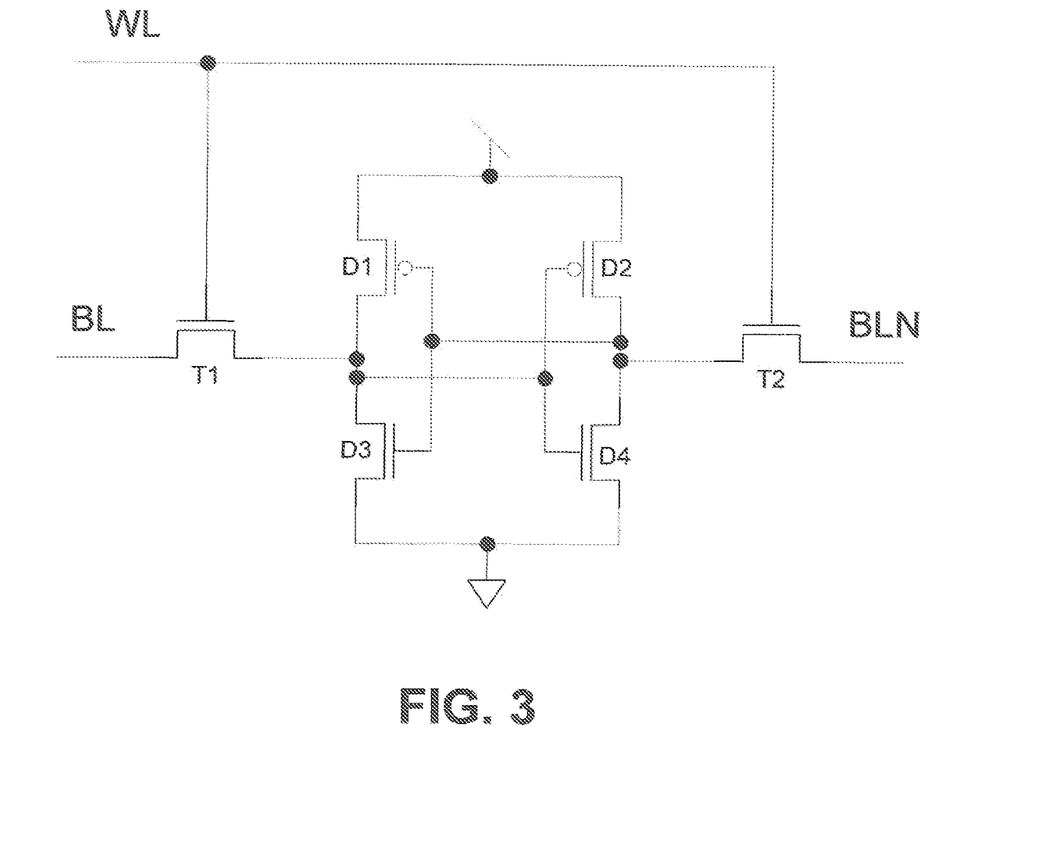
FIG. 3 shows one embodiment of a base cell of a register file.

FIG. 3 shows one way in which a base cell may be constructed by using a standard six transistor ("6-T") static Random Access Memory ("SRAM") cell. A base cell so constructed provides a high density storage solution, but only provides a single port from which the cell may be either written or read ("1-RW"). The "data storage" component of this cell consists of a standard cross-coupled inverter pair (transistors D1-D4), and transistors T1 and T2 comprise the "RW" (read-write) port. This cell has the property that a cell selection mechanism is included within a cell. The signal labeled "WL" (word-line) in this construction determines whether signals labeled "BL" (bit-line) and "BLN" (bit-line-bar) affect or are affected by the value stored in the cell. Such construction of a base cell allows the "BL" and "BLN" signals to be directly shared among multiple base cells, by allowing the signal labeled "WL" to perform initial register file bit selection without the need for any external logic.

Figure 4:
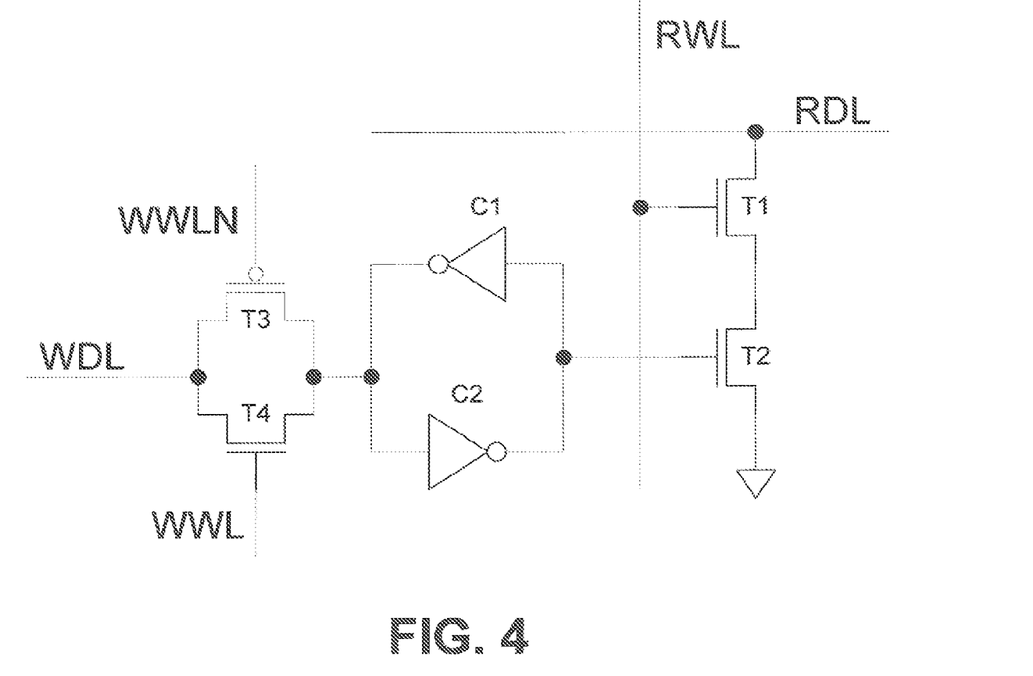
FIG. 4 shows another embodiment of a base cell of a register file.

Typically register files are constructed with a base cell which has at least one read port coupled with an independent write port. FIG. 4 is an example of a typical organization of such a base cell. The "data storage" component of this cell consists of a standard cross-coupled inverter pair (inverters labeled C1 and C2). The read port is comprised of transistors labeled T1 and T2 and the write port is comprised of transistors labeled T3 and T4. The number of read and/or write ports may be adjusted by duplicating the associated read or write logic. This cell so constructed has the property that a cell selection mechanism for both the read and write ports is included within the cell. Signals labeled WWL (write-word-line) and WWLN (write-word-line-bar) control when the base cell is being written and hence allow multiple base cells to directly share the same write-data-line ("WDL") signal. The signal labeled RWL (read-word-line) controls which cell is being read and hence allows multiple cells to share the signal labeled RDL (read-data-line). If no RWL is active, external circuitry needs to pull the RDL up to a high value. If a RWL is active (i.e., high) and the data storage contain a low value (i.e., gate of T2 will be high), RDL will be pulled low through T1 and T2. However, if the data storage contains a high value (i.e., gate of T2 is low), the base cell will not drive the RDL value, and instead an additional analog external circuit is needed to hold the RDL high. The analog nature of this RWL/RDL approach typically needs special circuit analysis techniques to characterize its behavior and is typically not compatible with standard system-on-chip ("SOC") cell based static timing techniques.

Figure 5A:
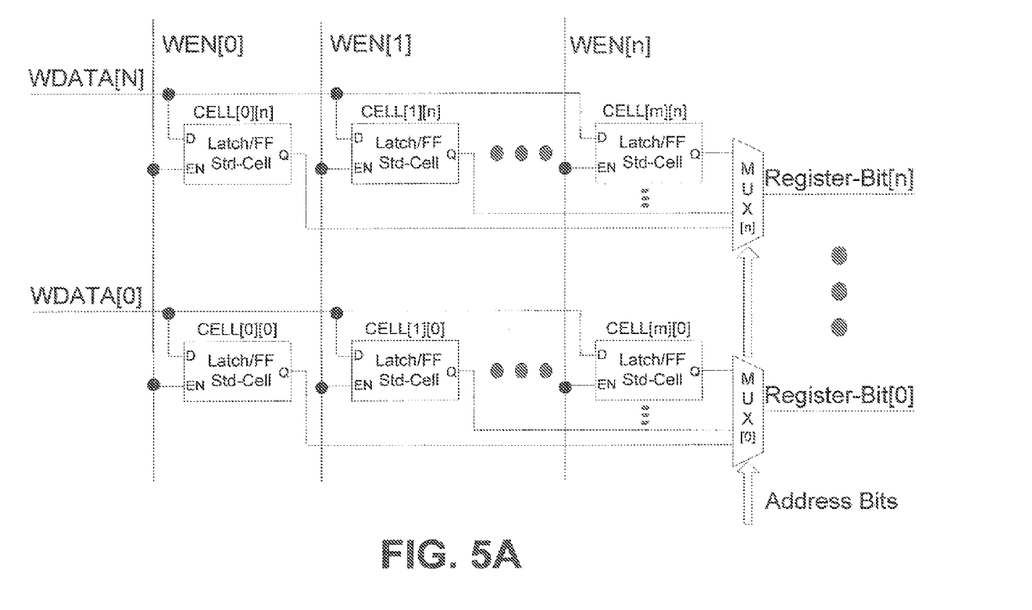
FIG. 5A shows one embodiment of a register file.
Figure 5B:
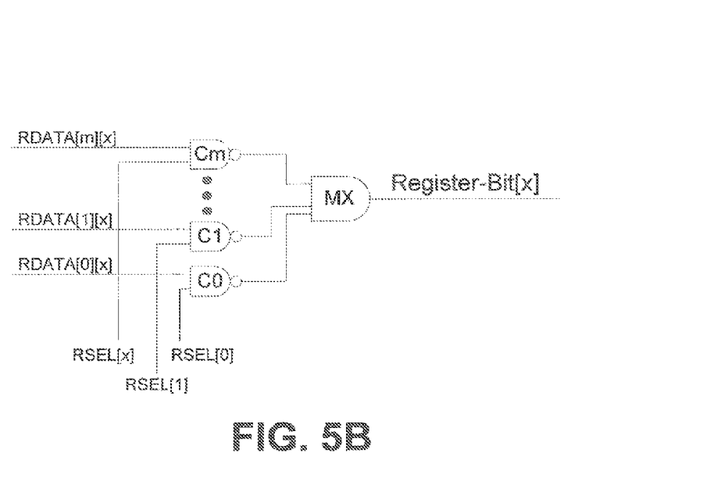
FIG. 5B shows one embodiment of a base cell used in the register file shown in FIG. 5A.

A typical way to create a register file organization which is compatible with SOC cell based static timing techniques is shown in FIG. 5A. The base cell used in this figure is a standard cell latch or flip-flop (FF) with a write enable (EN) pin. As shown in this figure, the WDATA (write-data) signal is common among multiple base cells, and the EN pin is used to select which cell should be written. This pushes the write port selection logic into the base cell. In contrast, the read data port used in this organization is not contained within the base cell. A large multiplexer per output bit (labeled MUX[n] . . . MUX[0] in the figure) is used to select the appropriate base cell to read data from. The large multiplex may be created from smaller standard cell multiplier cells, or may be created with an array of standard cell NAND-AND cells as shown in FIG. 5B. In FIG. 5B, RSEL[ ] (read-select) control signals are generated by decoding the multiplex address selection bits and RDATA[ ] (read-data) signals are outputs of the base cells as shown in FIG. 5A. With the NAND-AND structure shown in FIG. 5B, the Register-Bit[x] goes low only if the both RSEL[ ] and its associated RDATA[ ] are high. This value would most likely be inverted before output of the register file. The construction of the register file shown in FIG. 5A is fully compatible with standard SOC cell based static timing techniques.

The subject matter disclosed herein presents a novel way to include into the base cell the first level of the read port NAND structure shown in FIG. 5B (cells labeled as "C0", "C1", and "Cm") such that the second level AND (i.e., MX) between two adjacent cells from FIG. 5B (i.e., cells labeled C0, C1, . . . , Cm) is also included into the base cell. This approach results in few overall transistors and less silicon area required by the register array while retaining a register file organization which is fully compatible with standard SOC cell based static timing techniques. FIG. 6B shows one embodiment of the present invention which has the logic of this new read port organization.

Figure 6A:
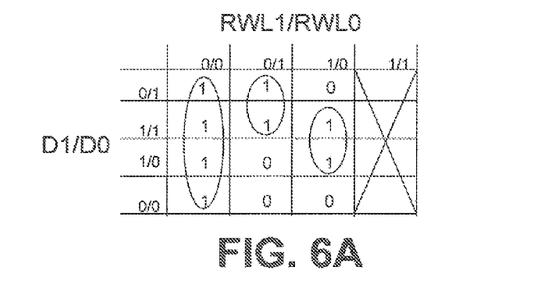
FIG. 6A illustrates an example truth table for a circuit shown in FIG. 6B.
Figure 6B:
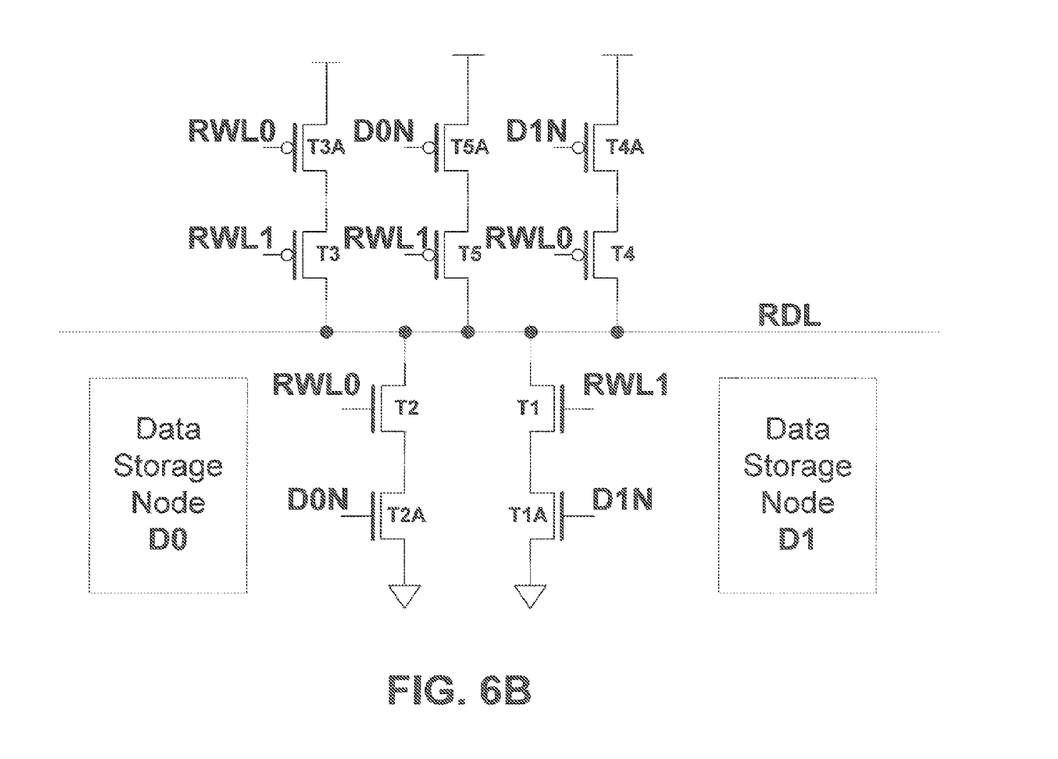
FIG. 6B illustrates an example embodiment of two base cells with a shared read port in a register file.

FIG. 6A shows the truth table which is implemented by the logic shown in FIG. 6B. This truth table provides appropriate values of read-data-line, ("RDL" as labeled in FIG. 6B) for different read-word-line ("RWL" as labeled in FIG. 6B) and different cell data storage values. In general, the "RDL" is held high if no "RWL" is active (active high in this case). The register file organization requires only one "RWL" to be active at a time per array. When a "RWL" is active the "RDL" is driven low only if the associated data storage node contains a low value; otherwise the "RDL" is held high. Transistors T1 and T1A are responsible for pulling "RDL" low when "RWL1" is active and its associated data storage node contains a low value. Transistor T2 and T2A are responsible for pulling "RDL" low when "RLW0" is active and its associated data storage node contains a low value. Transistor T3 and T3A are responsible for holding the "RDL" high when neither "RWL1" nor "RWL0" is active. Transistors T4 and T4A hold the "RDL" high if "RWL1" is high and its associated data is low by taking advantage of the fact that "RWL0" low means that "RWL1" might be high. Transistors T5 and T5A perform the same function as T4 and T4A but for "RWL0" and its associated data storage element. An embodiment of the present invention described in FIG. 6B includes two vertical read-word-lines (RWL's) for each resulting horizontal read-data-line (RDL). The selection logic between different RDL's is not included in the base cell.

Figure 7:
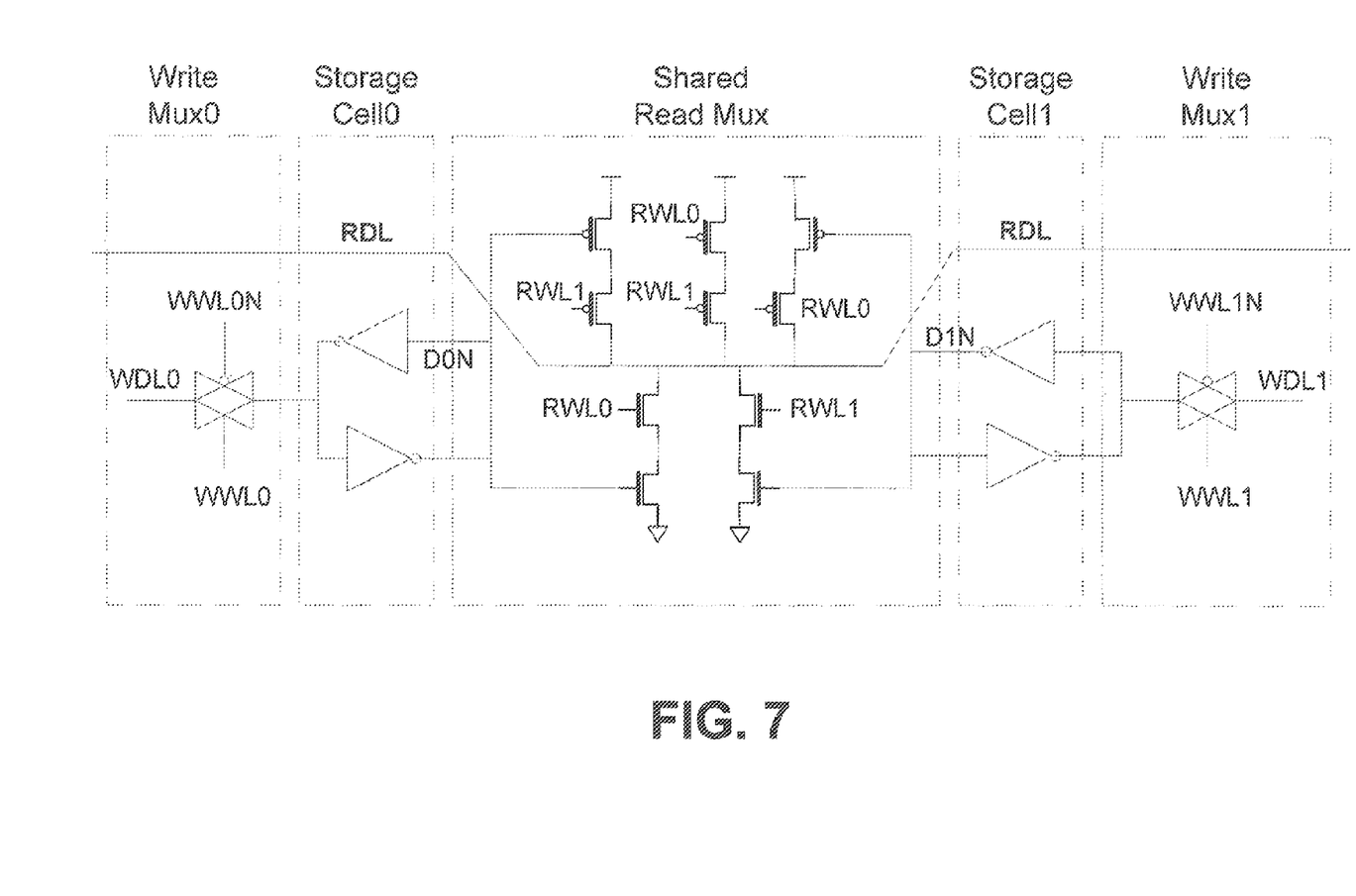
FIG. 7 illustrates an example embodiment of two base cells with read and write ports in a register file.

FIG. 7 shows a complete transistor description of a "1R, 1W" register base cell having the logic described in FIG. 6B, according to one embodiment of the present invention. This register base cell includes five main sections which are outlined and labeled in FIG. 7. The circuit labeled "Storage Cell0" stores one of the two bit values stored in the base cell with the other bit value is stored in circuit outlined and labeled as "Storage Cell1". The circuit outlined and labeled "Write Mux0" allows the value of "Storage Cell0" to be written and the circuit labeled "Write Mux1" allows the value "Storage Cell1" to be written. The circuit labeled "Shared Read Mux" is shown in more detail in FIG. 6B. Other "Write-Mux" and "Storage-Cell" logic organizations may be mated with the "Shared-Read-Mux" organization without affecting the spirit of the present invention. In addition, embodiments of the present invention were described in terms of a register file with one read port and one write port ("1R,1W"). These can be easily extended to a register file with multiple read or write ports by using multiple copies of the appropriate read or write logic described herein. In addition the embodiment is described and shown with series transistors in a certain preferred order, but the series transistors may be reordered or rearranged to share transistors with the same gate transistor connection without affecting the overall function of the circuit.

In an SOC standard-cell design, the standard-cells are designed for a specific standard cell pitch. In general, standard cells which are routed by automatic place and route software (APR) are designed to have a fixed height and only the width that varies based on the requirements of the cell function. Other embodiments of the present invention may allow the physical layout of the register-bit-cell shown FIG. 7 to be implemented in a manner compatible with the pitch of the standard cells used in the rest of the design. Referring back to FIG. 2, this approach allows all the logic which is not part of the register file base cell to be implemented in other standard cells which fit on the standard cell grid. To allows this, the register file base cell needs to be designed in such a way that the layout of this cell has one dimension which when multiplied by a small integer (the smaller the better) gives a number which is an integral of the standard cell pitch height. For example, if the standard cell pitch is designed to be thirteen metal-1 wire tracks high, then a layout for the standard cell shown in FIG. 7 may have a layout with one dimension 39 metal-1 wire tracks in size. Thirty-nine may be chosen since it is three times the standard cell pitch of 13 tracks.

Figure 8:
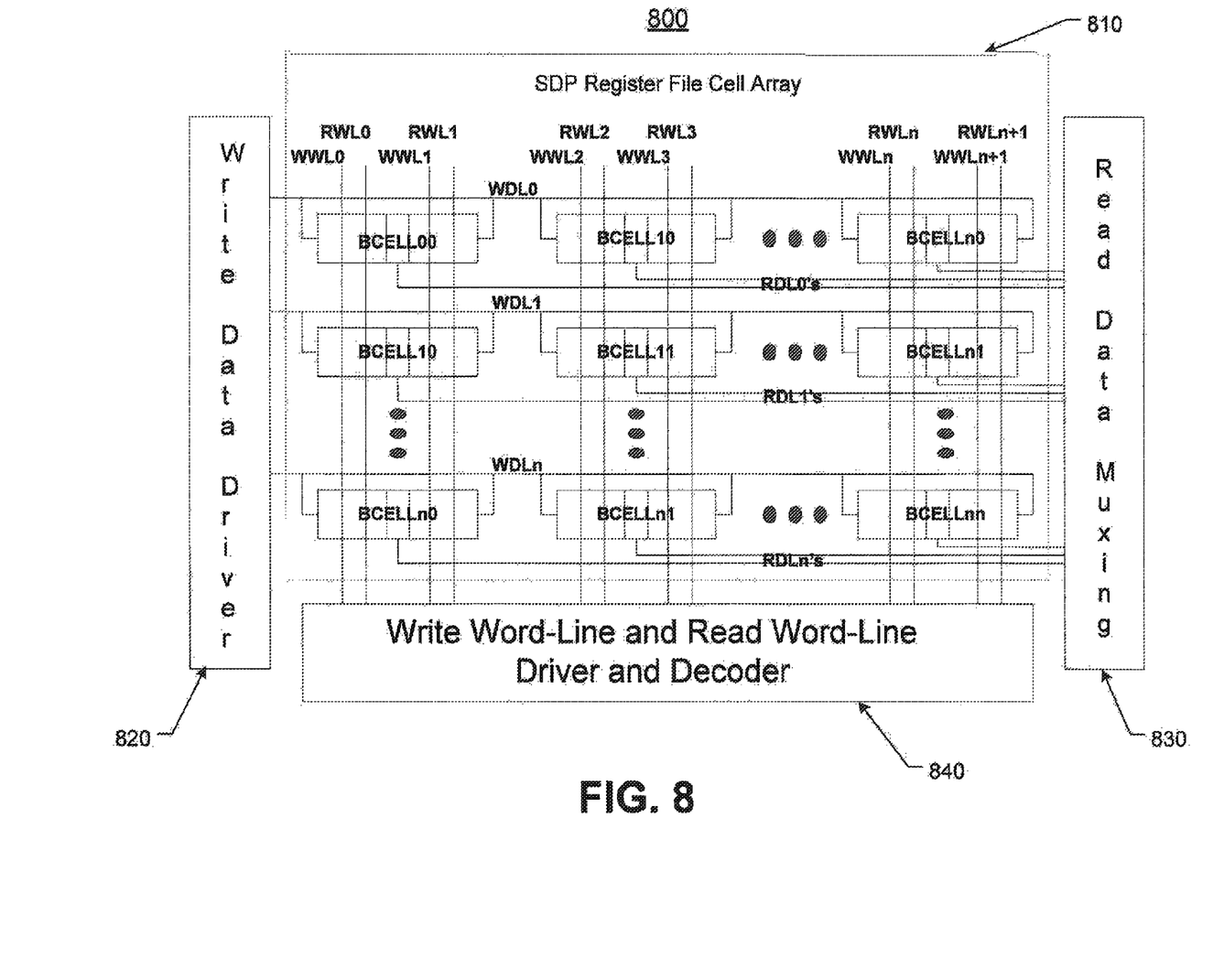
FIG. 8 shows an example register file which incorporates cell structures illustrated in FIG. 7.

FIG. 8 shows the top level organization of a register file where part of a write port and part of a read port data selection logic are included within the base cell, according to the embodiment of the present invention shown in FIG. 7. Register file 800 includes a register file cell array 810, a write data driver 820, a read data muxer 830, and a write word line ("WWL") and read word line ("RWL") driver and decoder 840. Register file cell array 810 includes a plurality of bit cells (labeled BCELL00 to BCELLnn) similar to the bit cell described in FIG. 7. Some bit cells in register file cell array share WWL and RWL as shown in the figure. Write Wordline and Read Wordline Driver and Decoder 840 generates states of the WWL and the RWL. Write data driver 820 generates states for write-data-lines (WDLs), which are shared by multiple base cells that use WWLs to select which cell actually gets written to. As shown in FIG. 8, each base cell has a read-data-line (RDL) which corresponds to an output from a pair of cells that make up a base cell as described in FIG. 7. As shown, there are two RWL's going to each base cell which select which storage cell value to output on the base cell's RDL. The block labeled "Read Data Muxing" selects an appropriate RDL value from the corresponding set of RDL's in a manner similar to what was shown in FIG. 5A or 5B.

As described above, the logic requirement of the read and the write port are partly independent of each other. Different combinations of the read port and write port logic as shown herein and combinations of the shown read port or write port logic with different corresponding write port or read port logic do not affect the spirit of the present invention. In addition, a different base cell data storage transistor organization may be used without affecting the scope of the present invention. Data storage transistor organizations shown above in various embodiments are not the only ones appropriate for use. Embodiments of the present invention are described in terms of the high and low state of the data storage node. However, since an data storage transistor organization typically includes two nodes which are inverted from each other, the embodiments could easily be described in terms of the opposite data state organization without affecting the spirit of the present invention. The embodiment was as described in terms of a "WWL" and a "RDL", but the embodiment shown in FIG. 8 could readily be adapted to an organization using a "WWLN" (inverted "WWL" signal) and/or a "RDLN" (inverted "RDL" signal).

Figure 9:
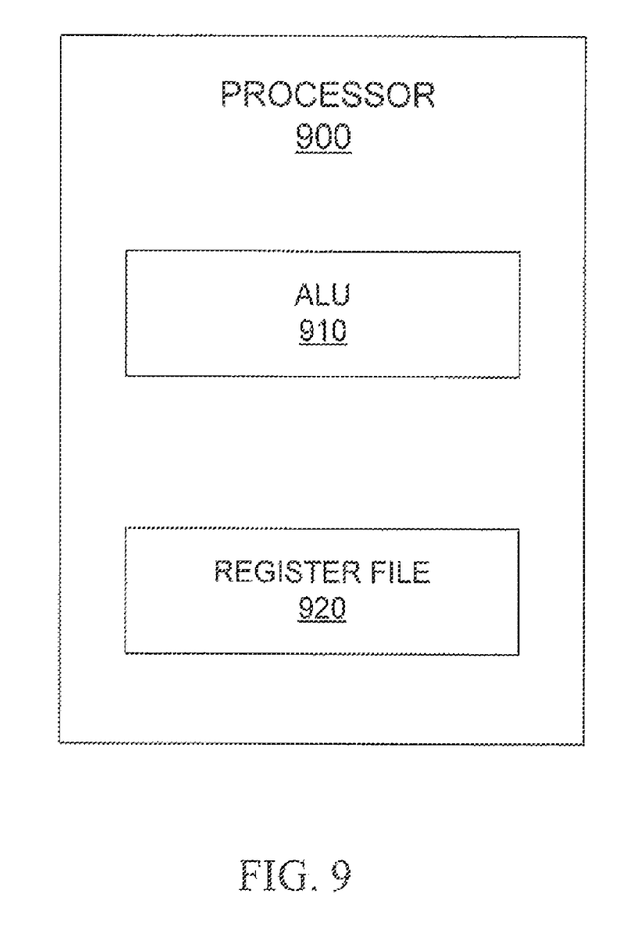
FIG. 9 shows an example processor having a register file implemented according to FIG. 8.

FIG. 9 shows a processor 900 having a register file constructed according to one embodiment of the present invention. Process 900 may include an arithmetic logic unit (ALU) 910 and one or more register files 920. ALU 910 may perform arithmetic operations such as addition, subtraction, etc. for processor 900. Register file 920 may be implemented according to an embodiment illustrated in FIG. 8.

Figure 10:
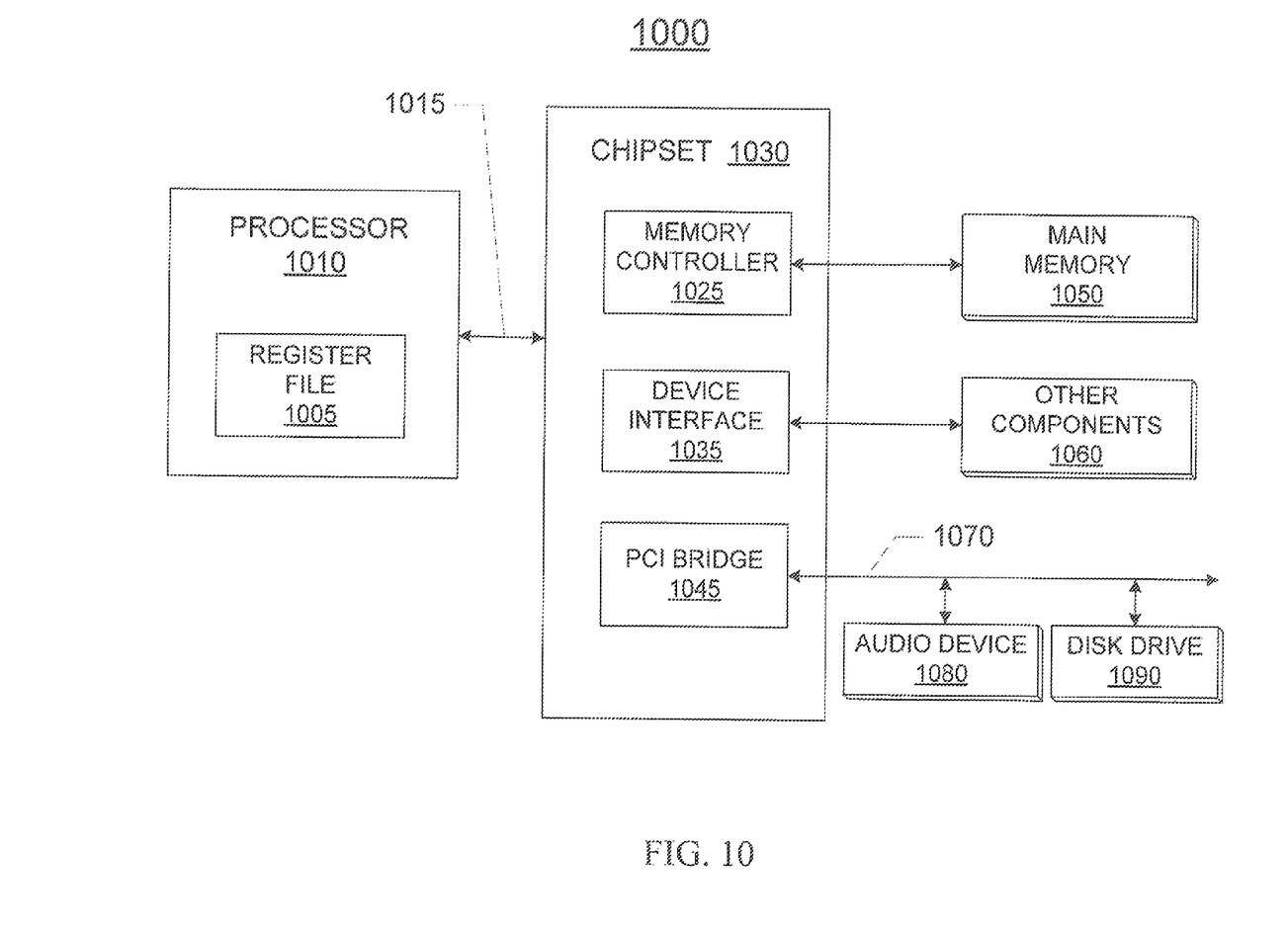
FIG. 10 shows an example computing system which incorporates a register file implemented according to FIG. 8.

FIG. 10 shows an example computing system 1000 which incorporates a register file implemented according to FIG. 8. Computing system 1000 may comprise one or more processors 1010 coupled to a system interconnect 1015. Each processor may further include one or more processing cores. Processor 1010 may include one or more register files 1005, implemented according to an embodiment illustrated in FIG. 8. Although not shown in FIG. 10, other components of computing system 1000 (e.g., chipset 1030, etc.) may also include one or more register files implemented according to an embodiment shown in FIG. 8.

The computing system 1000 may also include a chipset 1030 coupled to the system interconnect 1015. Chipset 1030 may include one or more integrated circuit packages or chips. Chipset 1030 may comprise one or more device interfaces 1035 to support data transfers to and/or from other components 1060 of the computing system 1000 such as, for example, BIOS firmware, keyboards, mice, storage devices, network interfaces, etc. Chipset 1030 may be coupled to a Peripheral Component Interconnect (PCI) bus 1070. Chipset 1030 may include a PCI bridge 1045 that provides an interface to the PCI bus 1070. The PCI Bridge 1045 may provide a data path between the processor 1010 as well as other components 1060, and peripheral devices such as, for example, an audio device 1080 and a disk drive 1090. Although not shown, other devices may also be coupled to the PCI bus 1070.

Additionally, chipset 1030 may comprise a memory controller 1025 that is coupled to a main memory 1050. The main memory 1050 may store data and sequences of instructions that are executed by the processor 1010 or any other device included in the system. The memory controller 1025 may access the main memory 1050 in response to memory transactions associated with the processor 1010, and other devices in the computing system 1000. In one embodiment, memory controller 1050 may be located in processor 1010 or some other circuitries. The main memory 1050 may comprise various memory devices that provide addressable storage locations which the memory controller 1025 may read data from and/or write data to. The main memory 1050 may comprise one or more different types of memory devices such as Dynamic Random Access Memory (DRAM) devices, Synchronous DRAM (SDRAM) devices, Double Data Rate (DDR) SDRAM devices, or other memory devices.

Although an example embodiment of the disclosed subject matter is described with reference to FIGS. 1-10, persons of ordinary skill in the art will readily appreciate that many other methods of implementing the disclosed subject matter may alternatively be used. For example, some of the blocks in block diagrams and/or schematics described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

What is claimed is:

1. A register file, comprising:
   a base cell having a first storage unit to store a first value and a second storage unit to store a second value; and
   a read port shared by the first and the second storage units, the read port capable of determining one of the first value or the second value to output at a time upon a read request.

2. The register file of claim 1, wherein the read port includes selection logic to determine the first value or the second value to output upon the read request.

3. The register file of claim 2, wherein the selection logic receives a first signal and a second signal, the selection logic determining the first value to output when the first signal is active and the second value to output when the second signal is active.

4. The register file of claim 3, wherein the first signal and the second signal are not both active at the same time during a normal operation mode.

5. The register file of claim 3, wherein the read port is coupled with a read-data-line, and wherein the base cell includes:
   a first pair of transistors configured to pull down the read-data-line when the first signal is active; and
   a second pair of transistors configured to pull down the read-data-line when the second signal is active.

6. The register file of claim 5, wherein the first pair of transistors includes a first transistor coupled to receive the first signal and a second transistor coupled to the first storage unit.

7. The register file of claim 6, wherein the second pair of transistors includes a third transistor coupled to receive the second signal and a fourth transistor coupled to the second storage unit.

8. The register file of claim 5, wherein the base cell includes a third pair of transistors configured to pull up the read-data-line when the first signal and the second signal are inactive.

9. The register file of claim 8, wherein the base cell includes:
   a fourth pair of transistors configured to pull up the read-data-line when the second signal is active and the second value is a first logical value; and a fifth pair of transistors configured to pull up the read-data-line when the first signal is active and the first value is the first logical value.

10. The register file of claim 9, wherein the first logical value is a low logical value.

11. The register file of claim 3, wherein the read port is coupled with a read-data-line, and wherein the base cell includes a pair of transistors configured to pull up the read-data-line when the first signal and the second signal are inactive.

12. The register file of claim 3, wherein the read port is coupled with a read-data-line, and wherein the base cell includes:
a first pair of transistors configured to pull up the read-data-line when the second signal is active and the second value is the first logical value; and
a second pair of transistors configured to pull up the read-data-line when the first signal is active and the first value is the first logical value.

13. The register file of claim 1, wherein the read port has a reduced number of transistors compared to a total of number of transistors required by two separate read ports if the first storage unit and the second storage unit each had a separate read port.

14. The register file of claim 1, wherein an output from the read port is compatible with an output from a standard static output node.

15. The register file of claim 1, wherein layout of the base cell fits within a standard cell grid.

16. The register file of claim 1, wherein the first value is a first bit of data and the second value is a second bit of data.

17. A processor, comprising:
an arithmetic unit to perform arithmetic operations; and
a register file to store data for the arithmetic operations, the register file including:
a base cell having a first storage unit to store a first value and a second storage unit to store a second value, and
a read port shared by the first and the second storage units, the read port capable of determining one of the first value or the second value to output at a time upon a read request.

18. The processor of claim 17, wherein the read port of the register file includes a selection logic to determine the first value or the second value to output upon the read request.

19. The processor of claim 18, wherein the selection logic receives a first signal and a second signal, the selection logic determining the first value to output when the first signal is active and the second value to output when the second signal is active.

20. The processor of claim 19, wherein the first signal and the second signal are not both active at the same time during a normal operation mode.

21. The processor of claim 17, wherein the read port has a reduced number of transistors compared to a total of number of transistors required by two separate read ports if the first storage unit and the second storage unit each had a separate read port.

22. The processor of claim 17, wherein an output from the read port is compatible with an output from a standard static output node.

23. The processor of claim 17, wherein layout of the base cell fits within a standard cell grid.

24. A computing system, comprising:
a processor to process data, the processor having a register file to store data, the register file including:
a base cell having a first storage unit to store a first value and a second storage unit to store a second value, and
a read port shared by the first and the second storage units, the read port capable of determining one of the first value or the second value to output at a time upon a read request.

25. The computing system of claim 24, wherein the read port includes selection logic to determine the first value or the second value to output upon the read request.

26. The computing system of claim 25, wherein the selection logic receives a first signal and a second signal, the selection logic determining the first value to output when the first signal is active and the second value to output when the second signal is active.

27. The computing system of claim 26, wherein the first signal and the second signal are not both active at the same time during a normal operation mode.

28. The computing system of claim 24, wherein the read port has a reduced number of transistors compared to a total of number of transistors required by two separate read ports if the first storage unit and the second storage unit each had a separate read port.

29. The computing system of claim 24, wherein an output from the read port is compatible with an output from a standard static output node.

* * * * *